United States Patent [19]

Matsueda

[11] Patent Number: 5,173,792
[45] Date of Patent: Dec. 22, 1992

[54] ELECTROOPTICAL DISPLAY WITH COMPENSATIVE REDUNDANCY MEANS

[75] Inventor: Yojiro Matsueda, Suwa, Japan
[73] Assignee: Seiko Epson Corporation, Japan
[21] Appl. No.: 454,396
[22] Filed: Dec. 19, 1989

[30] Foreign Application Priority Data

Dec. 20, 1988 [JP] Japan ................................ 63-321361

[51] Int. Cl.$^5$ ................................................ G02F 1/13
[52] U.S. Cl. ........................................ 359/59; 359/54; 359/58
[58] Field of Search .................. 350/333, 334, 336; 340/784; 445/3; 359/54, 58, 59, 60

[56] References Cited

U.S. PATENT DOCUMENTS

| | | | |
|---|---|---|---|
| 3,532,813 | 10/1970 | Lechner | 340/784 |
| 4,431,271 | 2/1984 | Okubo | 359/59 |
| 4,630,082 | 12/1986 | Sakai | 357/14 |
| 4,639,087 | 1/1987 | Cannella | 350/332 |
| 4,717,244 | 1/1988 | Hilsum et al. | 350/333 |
| 4,728,172 | 3/1988 | Cannella | 350/332 |
| 4,728,175 | 3/1988 | Baron | 350/336 |
| 4,748,445 | 5/1988 | Togashi et al. | 340/784 |
| 4,762,398 | 8/1988 | Yasui et al. | 350/334 |
| 4,820,222 | 4/1989 | Holmberg et al. | 445/3 |
| 4,851,827 | 7/1989 | Nicholas | 340/811 |
| 4,936,656 | 6/1990 | Yamashita et al. | 350/333 |
| 4,938,566 | 7/1990 | Takeda et al. | 350/333 X |
| 5,042,916 | 8/1991 | Ukai et al. | 359/59 |

FOREIGN PATENT DOCUMENTS

| | | | |
|---|---|---|---|
| 0112700 | 7/1984 | European Pat. Off. | 340/784 |
| 0302468 | 2/1989 | European Pat. Off. | 340/784 |
| 0051129 | 2/1990 | Japan | 340/784 |

OTHER PUBLICATIONS

H. Ogura et al., "5.5 Active Matrix Color LCD Fabricated by Using Redundancy and Repair System", *Japan Display* 86, pp. 208–211 (1986).

*Primary Examiner*—William L. Sikes
*Assistant Examiner*—Huy K. Mai
*Attorney, Agent, or Firm*—W. Douglas Carothers, Jr.

[57] ABSTRACT

An electrooptical display comprises a matrix of display elements in combination with isolation elements providing a display element circuit for each display element. Compensative redundancy elements are also included in each of the display element circuits wherein circuits containing at least one defect in either or both of a isolation element or a compensative redundancy element are relieved of the defect by their removal, such as, by electrical insolation, from the defective display element circuit. At least one combination of an insolation element and a compensative redundancy element containing the defect are removed so that the resultant voltage characteristics for writing capability relative to relieved display element circuits in the display will remain substantially the same as the existing voltage characteristics provided for writing capability relative to normal functioning display element circuits whereby the overall intensity of the display will remain substantially uniform in spite of the removal of the pair of elements.

31 Claims, 7 Drawing Sheets

ELECTROOPTICAL DISPLAY WITH COMPENSATIVE REDUNDANCY MEANS

BACKGROUND OF THE INVENTION

The invention relates to electrooptical displays and more particularly to active matrix type electrooptical displays with redundant means to provide for substantially complete relief from defective circuits of display elements, also referred to in the art as picture elements or pixels. The built-in redundancy provides a means to correct for defective display element circuits in the fabricated display thereby increasing their manufacturing yield.

Conventional electrooptical displays of the so called active matrix type, particularly of the switching device type, are designed with a redundancy system relative to the electrical isolation elements employed in addressing individual display elements in the display, such as disclosed in an article of Ogura et al., entitled "Active Matrix Color LCD Fabrication by Using Redundancy and Repair System", *Japan Display* 86, pp. 208–211 (1986). As an example, FIG. 1 herein discloses a circuit diagram which is a representative example of a liquid crystal display (LCD) element circuit employing thin film transistors (TFTs) as such isolation elements and for purposes of redundancy, as shown and demonstrated in the Ogura et al. article. As defined in the art, an isolation element is an electrically active or passive device that enhances the ability of a single display element to be selected or addressed without activating or otherwise affecting other non-selected or non-addressed display elements positioned on same addressing signal and scan lines. These elements can be categorized either as threshold devices, such as diodes, thin film diodes or MIM structures or as switching devices, such as TFTs. Particular concern here is the use of isolation elements in the form of switching devices.

In the particular FIG. 1 illustration, the active matrix type display comprises a plurality of display element circuits each having two TFTs 11 and 12 disposed at the intersection of the orthogonal electrical address or control lines, i.e., between the source, signal or data line, $X_m$, and scan or gate line, $Y_n$, and with their sources connected to signal line, $X_m$, and their gates connected to scan line, $Y_n$, and their drains connected at point P to the driving electrode of display element 20. Display element 20 comprises a driving or display electrode and opposing or counter electrode between which is disposed a light influencing means. As defined in the art, a light influencing means is a material that emits light, e.g., a gas plasma, or varies in optical properties, such as, intensity, phase or polarization relative to either being reflected from or transmitted through the material, e.g., liquid crystal material. An image signal, via signal line, $X_m$, is addressed to display element 20 via scan line, $Y_n$, and stored in the capacitance of liquid crystal material at display element 20.

The employment of a redundancy system in electrooptical displays has become an important component in the manufacture of these displays since their yield is greatly increased. Since an active matrix type electrooptical display contains several tens of thousands to several millions of thin film switching elements which are disposed in a relatively large area to form the display, it is extremely difficult to produce such a display without any circuit defects. In the case where there is no redundancy in the display isolation elements employed in an isolation scheme, any single inoperative isolation element will result in an inoperative display element, thereby reducing the total possible display yield. In such a situation, virtually 100% of the isolation elements must be operative in order to obtain a useful display device. However, with the use of double active isolation elements, such as TFTs 1 and 2, the yield of such displays can be increased. This increase in yield is accomplished by disconnecting a defective TFT with the remaining TFT being operative as an isolation element for operation of the display element. There is an exceedingly very low probability that both of these isolating elements adjacent to each other would both become defective. Therefore, if the redundancy system according to the embodiment shown in FIG. 1 is adopted, it is possible to relieve a defective display element by electrically cutting off or otherwise isolating a defective isolation element.

As proposed by Ogura et al, if one of the two TFTs is defective at a display element, it is isolated by laser trimming. Thus, if the remaining TFT isolation element operates properly, it provides an operable display element without any defect. However, in reality, complete relief from a circuit defect is not accomplished because the removal of a defective TFT causes a corresponding change in the operational voltage characteristics in the corrected display element and its circuit. Thus, a corrected display element will not functionally operate as the same voltage level at a normal, uncorrected display element thereby resulting in different operational voltage levels for the two types of elements. Since the applied voltage level on all signal lines is the same, the intensity between these two types of display elements will be different and the resulting contrast across the electrooptical display will not be uniform.

The difference in the operational voltage characteristics between these two types of display elements may be explained as follows. The sizes of gate-drain capacitances 13 and 14 of TFTs 11 and 12 in FIG. 1 may be designated as $C_3$ and $C_4$, respectively, and the size of the liquid crystal capacitance may be designated as $C_0$. When the scan line $Y_n$ changes from a select or addressed state to a non-select non-addressed state, the potential at the point, P, i.e., the potential at the driving electrode of display element 20, shifts by a voltage expressed as follows:

$$\Delta V_0 = V_G \times (c_3 + C_4)/C_3 + C_4 C_0,$$

wherein $V_G$ is an amount of change in the potential at scan line $Y_n$.

On the other hand, when TFT 12 is found to be defective, such as due to an open circuit or a short circuit eliminated by laser trimming, for example, and, consequently, the display element 20 is driven only by TFT 11 by itself, the shift voltage is changed and is expressed as follows:

$$\Delta V_1 = V_G \times C_3/(C_3 + C_0).$$

Since $V_0 \neq V_1$, there is a difference in voltage that is applied to display element 20 between the two different exemplified circumstances, i.e., in the case where display element 20 is driven by two TFTs 11 and 12 provided for redundancy purposes and in the case where display element 20 is driven by one TFT 11 or 12 due to a defect in the other TFT. As a result, a marked difference occurs in the transmission factor, i.e., there is a visible difference in the light transmission quality or opaqueness of defective display elements compared to normal display elements that have no defect. This marked difference is particularly noticeable in the case of a halftone LC display. Accordingly, the defective display element is not completely relieved of its defective state even with the use of a redundancy system such as illustrated in FIG. 1 since difference voltage level characteristics between a defective display element circuit relieved of its defective isolation element and a normal display element circuit requiring no correction will result in different operational voltage levels resulting in different display element intensities and, correspondingly, result in a different overall contrast across display. Further, there is no simple way to correct the applied voltages to defective display element circuits since the electrical address lines are the same in the case of all display element circuits and the voltage level on signal lines $X_m$ will be the same in all cases for addressed display element circuits.

Thus, it is a primary object of this invention to provide a redundancy system which is capable of substantially complete relief of display element circuit defects wherein no voltage difference results due to different display elements having one, two or even more redundant isolation elements operative to drive the matrix of display elements of the electrooptical display.

SUMMARY OF THE INVENTION

According to this invention, an electrooptical display is provided with compensative redundancy means in addition to isolation means to substantially compensate for changes in operational voltage levels between defective display element circuits relieved of their defects and normal display element circuits having no defects so that no such voltage level changes will occur. As a result, the driving voltage applied to all display elements may remain the same regardless of whether one or more isolation elements and, correspondingly, one or more associated compensative redundancy means relative to defective display element circuits are functionally relieved from operation. Highly uniform display intensity is, therefore, realizable, even for halftone applications, as well as increase yield in the manufacture of electrooptical displays.

More particularly, the electrooptical display of this invention comprises display element circuits to include redundant isolation means in the form, for example, of thin film transistors (TFTs) connected in parallel to each other in combination with compensative redundancy means in the form, for example, of storage capacitors connected in parallel to each other with both of these groups of elements coupled to the driving electrode of the display element. Even if either a parallel connected TFT portion or portions or a parallel connected storage capacitor portion or portions is defective, the defective display element circuit may be relieved by electrically cutting off, electrically isolating, mechanically or optically severing or otherwise removing the defective portion or portions from the defective circuit. Futhermore, if a defective TFT portion in combination with a storage capacitance portion or a defective storage capacitance portion in combination with a TFT are removed from the defective display element circuit as a pair and the size of the capacitance portion so removed is optimized, the same voltage signal that is applied to normally operating display elements will also be equally applicable to relieved display elements, i.e., $V_0$ is substantially same as or congruent with $V_1$.

In other words, the display element circuit defect that exists requires a disconnection of a TFT and its accompanying storage capacitor or capacitors thereby providing for substantially complete elimination of the defective portion, both mechanically and electrically, resulting in a display element that performs or behaves substantially in the same manner as normally operating display elements wherein no circuit defect existed.

The electrooptical display of this invention, therefore, is capable of substantially full and complete relief of a defective display element circuit in the display regardless of whether the defect occurs in an isolation element, such as a TFT and/or in a storage capacitor provided for each display element. As a result, the product yield can be remarkably increased making it possible to produce defect free electrooptical display devices or panels at reduced cost. In addition, the uniformity of picture intensity and resolution is improved by a significant margin thereby rendering it easily acceptable to increase the size in picture and pixel density. Also, in electrooptical displays utilizing display elements capable of handling picture data to form halftone images, it is possible to fabricate a strict gradation display, so that the range of application for the display device is enhanced.

Generally speaking, in active matrix type displays, if a DC voltage is applied to a defective display element, there results a reduction in the lifetime of the electrooptical material utilized in the display element. However, the present invention not only eliminates defects in a defective display element and its circuit, but, further, enables application of the same voltage to a display element relieved of its defective state as is applied in the case of normal display elements having no defective state. Therefore, it is possible to realize an electrooptical display having considerably high reliability and long life as well as uniform intensity.

In the case of the prior art where a plurality of TFTs are provided per display element, if a defective TFT per se is electrically isolated, a reduction in writing capability occurs, i.e., a change in the voltage level sufficient to properly write a video signal form the signal line to the driving electrode of the display element during the scanning period. In the case of the present invention, however, there is no change in the load to the isolation elements and, therefore, there is no corresponding change in the writing capability. Accordingly, there is an increase in the freedom of design without being hampered by or concerned about changes in voltage threshold levels to addressed display elements being significantly different due to defect correction of defective display element circuits.

Other objects and attainments together with a fuller understanding of the invention will become apparent and appreciated by referring to the following description and claims taken in conjunction with the accompanying drawings.

DESCRIPTION OF THE PREFERRED EMBODIMENTS

It should be noted at the outset that, while this invention is described in conjunction with an electrooptical display utilizing liquid crystal material as the light influencing means, it will be readily understood by those skilled in this art that the invention disclosed and claimed herein has equal applicability to electrooptical displays of the active matrix type utilizing either an active electrooptical material or medium, e.g., gas plasma, neon or argon medium, etc., or a passive electrooptical material or medium, e.g., a material that changes its optical properties or changes its response to ambient light when electrically addressed, such as liquid crystal, electrophoretic or electrochromic materials.

Further, while this invention has its basis at the present time for appropriate application to isolation elements of the switching device type rather than the threshold device type, particularly because isolation elements of the latter type, such as thin film diodes, presently do not contain any storage capacitance. However, it is within reason that in the future, the direction of technical changes will be such that this invention will also have equal applicability to electrooptical displays utilizing threshold devices as isolation elements. Therefore, it is within the scope of this invention that application of the compensative redundancy means of this invention will be more fully applicable to other isolation elements wherein the goal is to provide or otherwise maintain the original voltage operating characteristics to corrected display element circuits that is already applicable to normal display element circuits of an electrooptical display.

Figure 1:
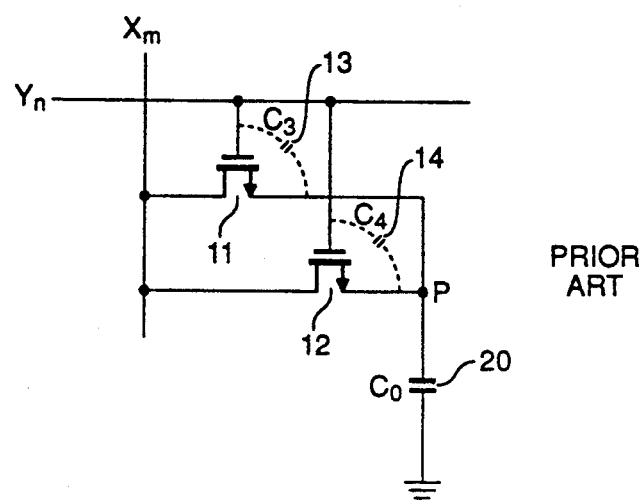
FIG. 1 is a circuit diagram illustrating a conventional display element circuit as utilized in an active matrix type electrooptical display.
Figure 2:
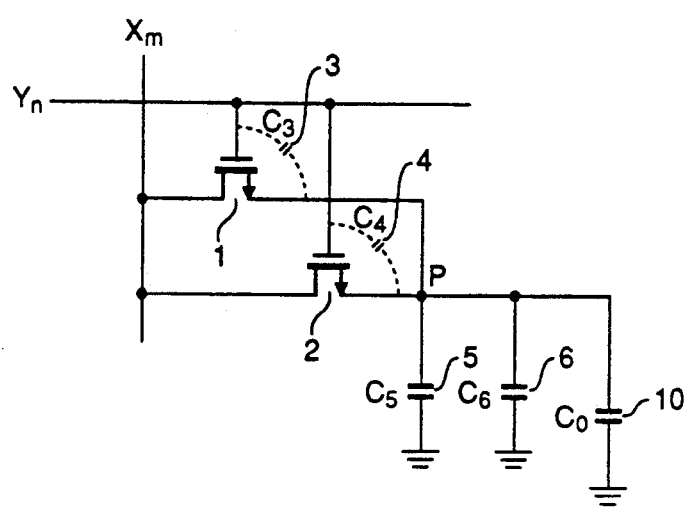
FIGS. 2-6 respectively illustrate different embodiments of a display element circuit utilized in an electrooptical display according to this invention.

Reference is now made to FIG. 2 illustrating the first embodiment of a display element circuit according to this invention for use in an electrooptical display, such as an active matrix liquid crystal display. As shown in FIG. 2, display element 10 is isolated from other display elements on common address lines $X_m$ and $Y_n$ by means of two TFTs 1 and 2 connected in parallel. TFTs 1 and 2 provided for a redundancy system in which a light influencing material, such as liquid crystal or other known electrooptic material is employed with display element 10. Both TFTs 1 and 2 have their respective source electrodes connected in common to signal line $X_m$, their respective gate electrodes connected in common to scan line $Y_n$ and their respective drain electrodes connected in common to point P comprising the driving electrode of display element 10. TFTs 1 and 2, being concurrently fabricated, are, therefore, electrically equivalent to each other in electrical properties and characteristics.

A particular importance in this invention relative to the display element circuit of FIG. 2 are compensative redundancy means comprising capacitors 5 and 6 formed in parallel with display element 10. Capacitors 5 and 6 are formed during the fabrication process for the backplane of the display wherein photolithographic techniques are employed to form the components of the display element circuits, except for the common counter electrode and address lines, on an insulating substrate, e.g., glass. The fabrication of additional storage capacitance in combination with additional isolation elements provides for a redundancy system wherein removal of a defective isolation element also includes an appropriate amount of storage capacitance so that the resultant applied voltage as well as the resultant stored potential on all display elements will be substantially the same in spite of any correction made to defective display element circuits in the electrooptical display.

If the sizes of the gate-drain capacitances 3 and 4 of TFTs 1 and 2 are respectively $C_3$ and $C_4$, the sizes of storage capacitors 5 and 6 are respectively $C_5$ and $C_6$, the size of the capacitance of electrooptical display element 10 is $C_0$ and, for practical purposes, the sizes of TFTs 1 and 2 with adequate writing capability, i.e., capable of placing a sufficient voltage level on the display element driving element representative of the video data signal on the source line, are equal to each other so that $$C_3 = C_4 \qquad (1)$$

and, further, if the following relationship holds true for storage capacitors 5 and 6:

$$c_5 = C_6 + C_0, \qquad (2)$$

then, full relief, i.e., relief of not only of a defective electrical element but also substantially full restoration of the electrical operating characteristics of a defective display element, may be achieved by electrically isolating a combination TFT and storage capacitor wherein either one of or both such electrical components are defective.

A defective isolation element is removed in the following manner. First, the address of a defective TFT element is obtained either electrically or optically. Specific examples of a method for detecting a defective TFT in the substrate state is as follows. One method is the use of a probe wherein the characteristics of each discrete TFT is inspected by applying the probe to the pixel electrodes together with the scan and signal lines. Another method is optical observation of a pinhole or a foreign defect detected by the use of a pattern recognition device. The third method involves the application of proper address signals applied to combination scan and signal lines to thereby indirectly detect a defective TFT.

In order to detect a defective TFT in the panel state, i.e., when the two substrates comprising the display panel have been assembled in conjunction with the electrooptical material, the method employed may be the location of the address of a defective TFT obtained from the image pattern displayed from the panel. For example, if there is a short between the gate and source of a TFT or a short between the a gate and the drain of a TFT, the scan line select pulse will also appear on the signal line. Therefore, the address of the defective TFT can be obtained from the timing when the select pulse appears on the signal line. If there is a short between the source and drain of a TFT, an image signal is applied to the driving electrode from the signal line when all the scan lines are placed in non-select state. Therefore, the address of the defective TFT is readily obtained from the displayed image pattern on the panel. Since the two TFTs of each display element circuit are electrically equivalent to each other and if the address of a defective TFT is obtained by a method other than from pure pattern recognition, a defective TFT may be determined by visual inspection.

A TFT that is determined to be defective and nonoperational may be electrically isolated from any possible utility by use of a laser trimming or other similar means. In this connection, storage capacitor 5 having a capacitance $C_5$ of a particular defective display element circuit is also eliminated or electrically isolated by the use of the same type of means. By cutting off capacitance $C_5$, it becomes possible to apply the same voltage to the now corrected display element circuit that is now driven by a single TFT as in the case of correctly operating display element circuits driven by a combination of two TFTs. Thus, the corrected defective display elements driven by one TFT function completely as a normal display element so that the voltage levels applied to and potential levels stored by all display elements will be substantially equal.

The foregoing is explained mathematically in detail as follows. When scan line $Y_n$ changes from its select state to non-select state, the potential at the display element driving electrode at point P shifts by certain voltage determined by the capacitance division between gate-drain capacitances $C_3$ and $C_4$ of TFTs 1 and 2, storage capacitors $C_5$ and $C_6$ and capacitance $C_0$ of display element 10. This shift in voltage may be expressed as follows:

$$\Delta V_0 = V_G \times (C_3 + C_4)/(C_3 + C_4 + C_5 + C_6 + C_0), \quad (3)$$

where $V_G$ is the amount of change in potential in scan line $Y_n$.

On the other hand, when, for example, TFT 1 is found to be defective and, consequently, TFT 1 and storage capacitor $C_5$ are electrically isolated or otherwise removed from operation in the display element circuit, the shift voltage may be expressed as follows:

$$\Delta V_0 = V_G \times C_4/(C_4 + C_6 + C_0) \quad (4)$$

In the case where TFT 2 is found to be defective and, consequently, TFT 2 and storage capacitor $C_5$ are electrically isolated or otherwise removed from operation in the display element circuit, the shift voltage may be expressed as follows:

$$\Delta V_2 = V_G \times C_3/(C_3 + C_6 + C_0) \quad (5)$$

From the equation (1),(2),(3),(4), and (5), the following relation is established:

$$\Delta V_0 = \Delta V_1 = \Delta V_2 \quad (6)$$

The foregoing equations demonstrate that it is possible to apply the same voltage to a display element that is driven by a single isolation element as is applied to a display element that is driven by two isolation elements. In other words, it is possible to correct a defective display element to function completely as a normal display element having the same voltage characteristics.

Thus, in a general electrooptical display having N TFTs per display element, if the capacitance of the electrooptic material per display element is $C_0$, the storage capacitor per display element is $C_s$, the gate-drain capacitance of the $i^{th}$ TFT is $C_n$ and the gate-drain capacitance of the remaining $N-1$ TFTs is $C_{n-1}$, the shift voltage may be expressed as follows:

$$\Delta V_0 = V_G \times (C_i + C_{n-1})/(C_i + C_{n-1} + C_2 + C_0) \quad (7)$$

On the other hand, when the $i^{th}$ TFT is found to be defective and, consequently, the $i^{th}$ TFT and a portion of the storage capacitor $C_s$, identified as $C_p$, are electrically isolated or otherwise removed from operation in the display element circuit, the shift voltage may be expressed as follows:

$$\Delta V_i = V_G \times C_{n-1}/(C_{n-1} + C_s + C_0 - C_p) \quad (8)$$

If the size of the storage capacitor that is electrically isolated, or $C_p$, is expressed as follows:

$$C_p = (C_0 + C_s) \times C_i/(C_i + C_{n-1}), \quad (9)$$

then, from the equations in (7),(8), and (9), the following relation may be obtained:

$$\Delta V_0 = \Delta V_i, \quad (10)$$

More specifically, if it is possible to selectively isolate a portion of the storage capacitance, $C_p$, as represented by equation (9), then, even if the $i^{th}$ TFT is extinguished, and the display element is driven by the remaining $N-1$ TFTs, the same voltage as in the case where the display element is driven by N TFTs is equally applicable where the display element is driven by $N-1$ TFTs.

Figure 3:
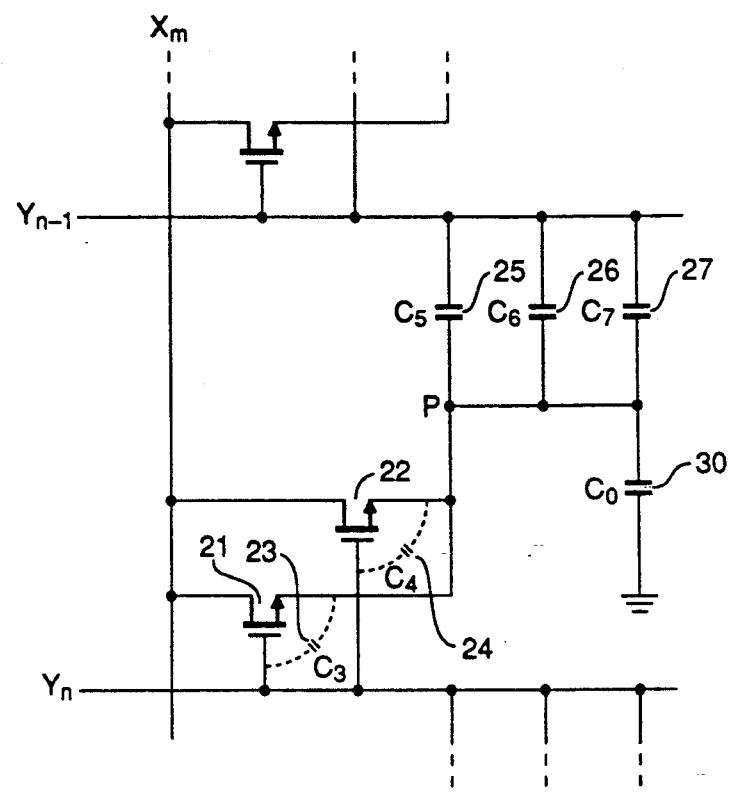

FIG. 3 discloses a circuit diagram of another embodiment comprising this invention. In this embodiment, the isolation elements comprise TFTs 21 and 22 with their source electrodes connected in common to signal line $X_m$, their gate electrodes connected in common scan line $Y_n$ and their drain electrodes connected in common at point P, which is the driving electrode of display element 30. The other or counter electrode of display element 30 is connected to the ground. The respective gate-drain capacitances $C_3$ and $C_4$ of TFTs 21 and 22 are indicated respectively at 23 and 24 in FIG. 3. Compensative redundancy means is provided in the form of storage capacitors 25, 26, and 27, respectively, represent capacitances $C_5$, $C_6$, and $C_7$ and these capacitors are interposed between the driving electrode at point P and common scan line $Y_{n-1}$ of the preceding display element stage. However, even with connection differences compared to FIG. 2, the basic operation of the display element circuit of FIG. 3 is the same as the embodiment shown in FIG. 2.

The sizes of the capacitances $C_3$, $C_4$, $C_5$, $C_6$, and $C_7$, and the size of the capacitance, $C_0$, of display element 30 are fabricated to substantially comply with the following relationships:

$$C_3 = C_4 \tag{11}$$

$$C_5 = C_6 = C_7 = C_0 \tag{12}$$

Then, even if a particular display element circuit is found to be defective, the same voltage that is applied to other display elements can be also applied to the defective display element by electrically isolating either one of the two TFTs 21 or 22 together with any two of the three storage capacitors 25, 26, or 27, depending, of course, on which of these elements are defective. As an example, if TFT 21 is found is to be defective, TFT 21 is electrically isolated and two storage capacitors 25 and 26, or 26 and 27, or 25 and 27 are also electrically isolated. On the other hand, if storage capacitor 25 is found to be defective, two storage capacitors 25 and 26, or 25 and 27, are electrically isolated together with either TFT 21 or 22. Further, if TFT 21 is defective along with storage capacitor 25, two storage capacitors 25 and 26, or 25 and 27, are electrically isolated together with TFT 21. As a result, a defective display element can be substantially freed, if fully relieved, of its defective status regardless of whether a TFT or a storage capacitor is in a defective state.

It should be noted that it would not be possible to provide the type of relief envisioned here in the case where both TFTs 21 and 22 simultaneously defective or when the three storage capacitors 25, 26, and 27 are simultaneously defective. However, the probability of this being the case is extremely low. Therefore, it is possible to provide for full relief of defective isolation elements in practically every circumstance involving a defective display element.

Figure 4:
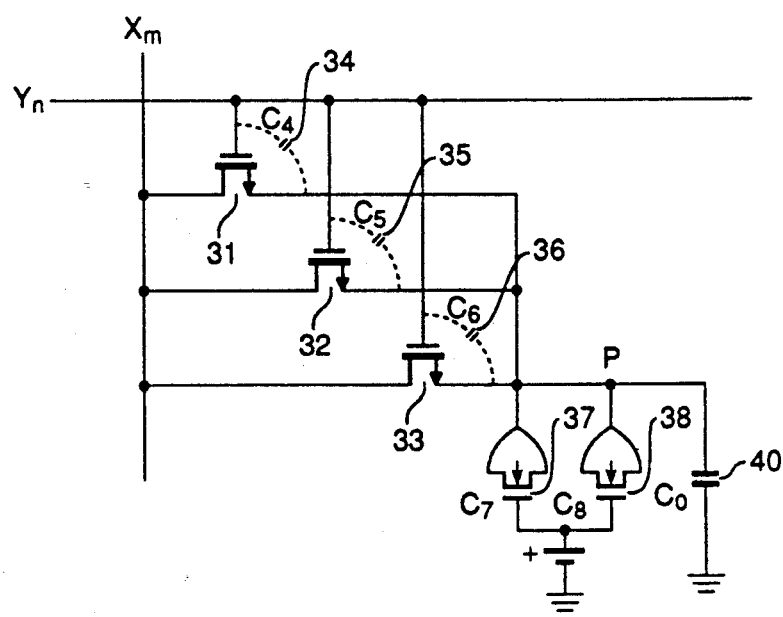

FIG. 4 illustrates a further embodiment of this invention. In the particular embodiment shown in FIG. 4, there are three isolation elements employed for the purposes of redundancy. In the case here, three isolation elements comprise TFTs 31, 32, and 33 connected in parallel across the $X_m$ and $Y_n$ address lines. As in the case of the previous embodiment, the drains of TFTs 31, 32, and 33 are connected in common to the driving electrode of the display element 40 at point P. The source of these TFTs 31, 32 and 33 are connected in common to signal line $X_m$ while the gates of TFTs 31, 32 and 33 are connected in common to scan line $Y_n$. To this extent, the configuration shown in FIG. 4 is fairly similar to that shown in FIG. 2 embodiment, except that one additional redundant TFT 33 is provided. However, the embodiment of FIG. 4 further includes compensative redundancy means comprising two storage capacitors 37 and 38 in the form of MOS capacitances, which basically function in the same manner as capacitors 5 and 6 shown in FIG. 2. MOS capacitors 37 and 38 are of the so called undoped type, although the doped type may also be employed but require additional processing to fabricate, particularly relative to self-alignment. MOS capacitors 37 and 38 are shown as a p-type structure requiring the use of a positive gate bias voltage, as illustrated in FIG. 4.

If the sizes of the respective gate-drain capacitances 34, 35, and 36 of the respective TFTs 31, 32, and 33 are $C_4$, $c_5$, and $C_6$, the sizes of the two storage capacitors 37 and 38 are respectively $C_7 C_8$, and the size of the capacitance of the display element 40 is $C_0$, then the following relationships are established:

$$C_4 = C_5 = C_6 \tag{13}$$

$$C_7 C_8 = C_0. \tag{14}$$

Then, even if a particular display element 40 is found to be defective in operation, the same voltage that is applied to other display elements containing no defects can be correspondingly applied and will be substantially equal to the voltage applied to the defective display element by electrically isolating any one of three TFTs 34, 35, or 36 that may be defective and either one of the two storage capacitors 37 or 38. As an example, if TFT 31 is found to be defective, TFT 31 is then electrically isolated along with either one of the storage capacitors 37 or 38. On the other hand, if storage capacitor 37 is found to be defective, storage capacitor 37 is then electrically isolated along with any one of the three respective TFTs 31, 32, or 33. Thus, a defective display element 40 may be completely relieved of its defective condition regardless of whether the defective component is a TFT or a storage capacitor.

As previously indicated, in most cases, relief is possible with respect to all defective display elements except in those cases where all three TFTs 31, 32, and 33 are concurrently defective and/or when the two storage capacitors 37 and 38 are concurrently defective, which is highly unlikely to occur due, in part, to the increased number in redundant isolation elements, as well as in the use of compensative redundancy means in the form of MOS capacitors employed in this particular embodiment.

Figure 5:
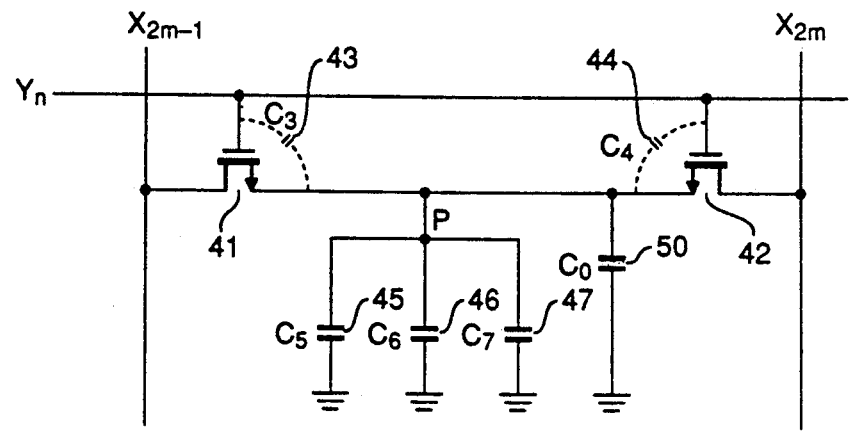
Figure 5A:
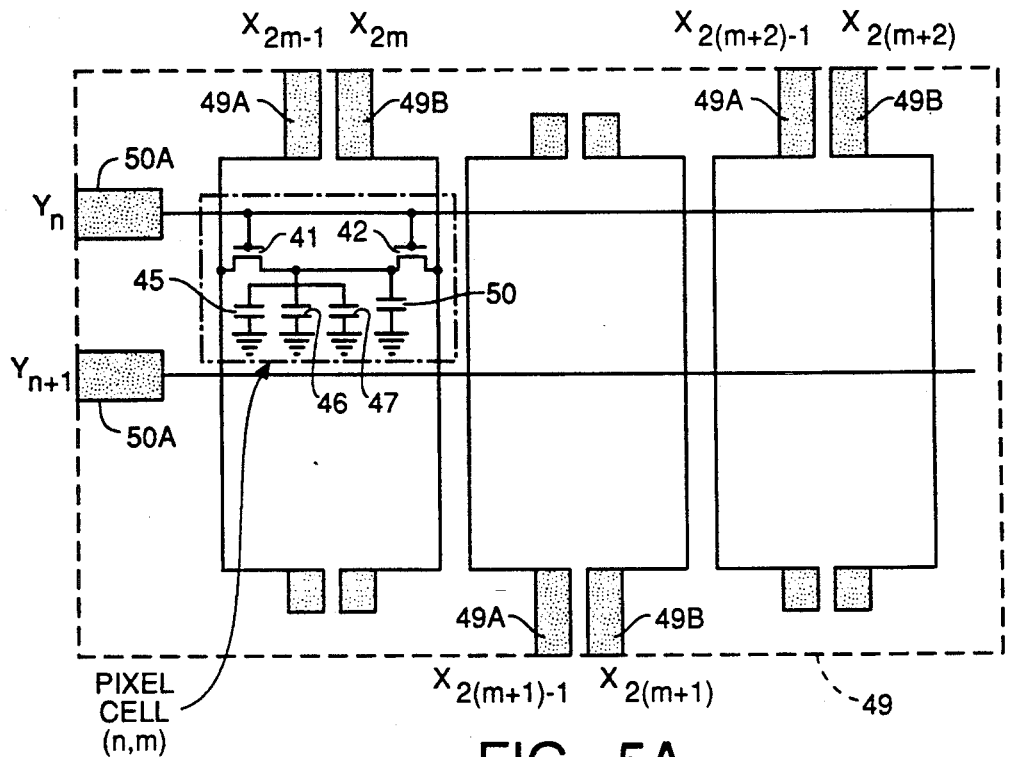
FIG. 5A illustrates the display element circuit of FIG. 5 as utilized in an active matrix substrate.

FIGS. 5 and 5A disclose another embodiment of this invention wherein a redundancy system is adopted that comprises two TFTs 41 and 42 as isolation elements relative to two adjacent signal lines $X_m$, which isolation elements are provided for each display element 50 in the active matrix display. TFTs 41 and 42 have their respective gate electrodes connected in common to scan line $Y_n$ and their respective drain electrodes connected in common to display element driving electrode at point P. However, the source electrodes of both TFTs 41 and 42 are connected respectively to different signal lines $X_{2m-1}$ and $X_{2m}$. Storage capacitors 45, 46, and 47 are connected in parallel with display element 50.

If the size of the capacitance of display element 50 is $C_0$, the sizes of storage capacitors 45, 46, and 47 are respectively $C_5$, $C_6$, and $C_7$, and the sizes of the gatedrain capacitances 43 and 44 of the two TFTs 41 and 42 are respectively $C_3$ and $C_4$, then the following relationships can be established:

$$C_3 = C_4 \tag{11}$$

$$C_5 = C_6 = C_7 = C_0 \tag{12}$$

Then, even if one or more display elements 50 are found to be defective in operation, the same voltage that is applied to other normal operating display elements 50 can also be applied to defective display elements 50 by electrically isolating either one of the two TFTs 41 or 42 or any two of the three storage capacitors 45, 46, or 47, of course, depending on which of these elements are defective.

FIG. 5A shows the display element circuit of FIG. 5, identified as pixel cell (n,m) in conjunction with an active matrix substrate 49 comprising a plurality of such pixel cells. Signal lines $X_{2m-1}$ and $X_{2m}$ as well as all signal line pairs to the last pair of such signal lines, shown here as signal lines $X_{2(m+2)-1}$ and $X_{2(m+2)}$, have respective pairs of input pads 49A and 49B along opposite edges of active matrix substrate 49. By the same token, scan lines $Y_n$ and $Y_{n+1}$ and so on have input pads 50A along another edge of active matrix substrate 49.

In this particular embodiment, the signal lines $X_{2m-1}$ and $X_{2m}$ are redundant so that there is provided the following two features. The first feature resides in the fact that the address of a defective TFT can be readily obtained in a very accurate manner. The address of a defective TFT may be electrically obtained by using one of following two different methods. One method is where a test probe is applied directly to each driving electrode of a display element to determine the voltage at the display element. In the other method, proper address signals are applied to the signal and scan lines, via input pads 49A, 49B and 50A, to obtain the address and position of the defective TFT. Either of these methods are carried out automatically by an automated tester. On the other hand, the address of a defective TFT may be optically obtained to determine the location of a defective TFT by making a comparison between the image pattern that is displayed on a completed electrooptical display panel and electrically addressing only add signal lines, $X_m$, $X_{m+2}$, $X_{m+4}$, ..., where m=1, and the image pattern that is displayed by electrically addressing only even signal lines, $X_m$, $X_{m+2}$, $X_{m+4}$, ..., where m=2.

The second feature resides in the fact that it is possible to obtain relief for a defective isolation element due to a lack of electrical integrity of one of the redundant signal lines connected to a good isolation element or, also, possibly due to the removal of the defective isolation element from operation in the display element circuit affecting the electrical integrity of the connected signal line. For example, a signal line $X_{2m-1}$ or $X_{2m}$ is disconnected from an isolation element of a particular display element circuit or a short exits between a signal line $X_m$ and a scan line $Y_n$ due, for example, to an isolation element. If there is a disconnection, then repair can be made by electrically connecting down stream the separate ends of the disconnected signal line to its adjacent redundant signal line, such as, by connecting an input pad 49A as adjacent input pad 49B. If the respective terminals of the two signal lines $X_{2m-1}$ and $X_{2m}$ are shorted to each other, then, if the same signal is applied to both lines, then, the short will be of no consequence unless the signal lines $X_{2m-1}$ and $X_{2m}$ happen to be disconnected at two or more different locations. On the other hand, if either signal line $X_{2m-1}$ or $X_{2m}$ and scan line $Y_n$ are shorted to each other, the particular signal line $X_m$ in question can be cut off at adjacent sides of the position of the short with the scan line $Y_n$ and, thereafter, electrically connecting the cut off ends of the disconnected signal line to its adjacent redundant signal line via connection of an input pad 49A to an adjacent input pad 49B. As a result, both the signal and scan lines $X_m$ and $Y_n$ will be relieved of such a short defect.

Figure 6:
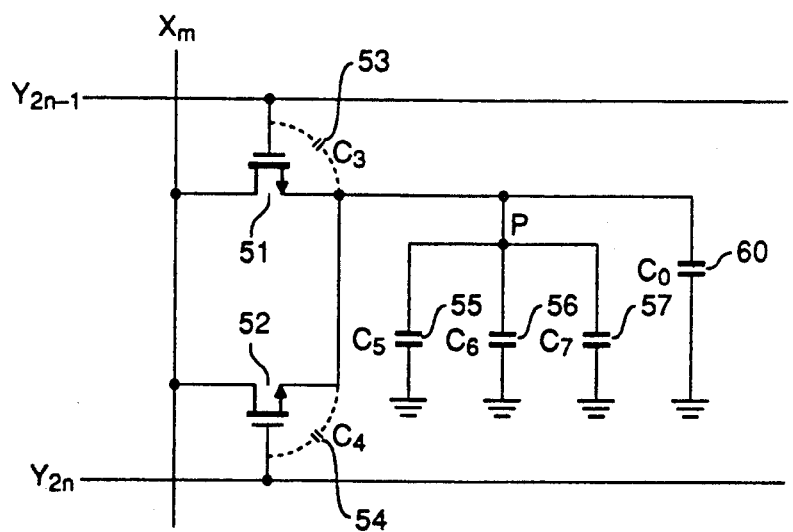
Figure 6A:
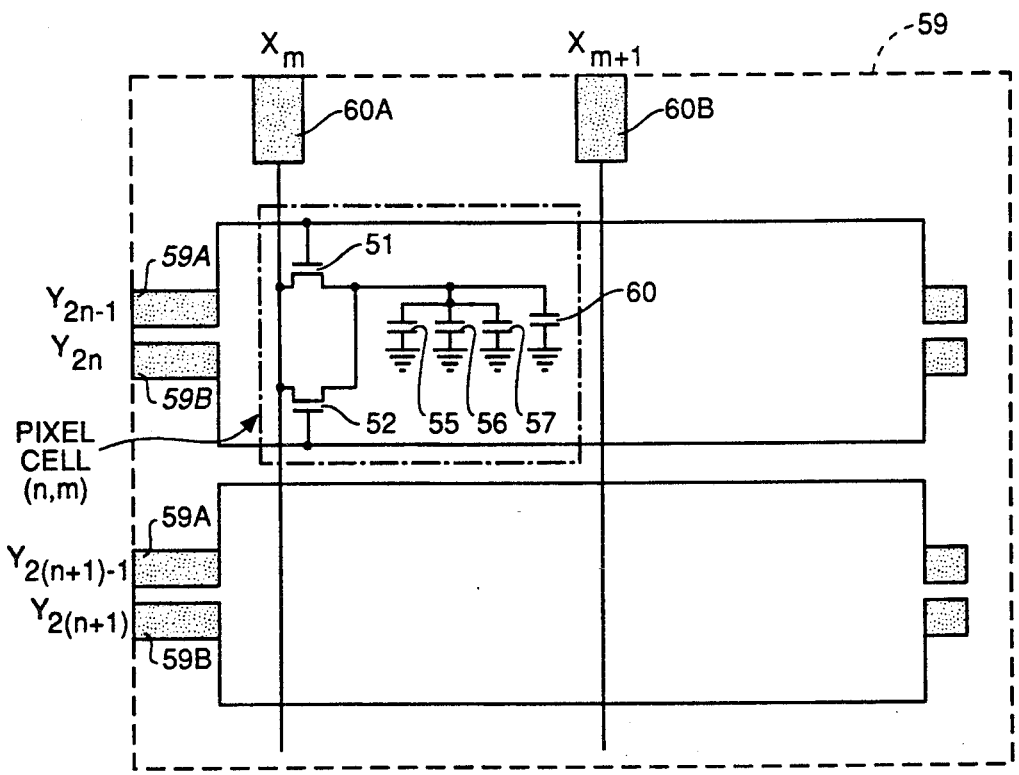
FIG. 6A illustrates the display element circuit of FIG. 6 as utilized in an active matrix substrate.

FIGS. 6 and 6A disclose another embodiment of this invention which is similar in various aspects to the embodiment shown in FIGS. 5 and 5A. However, the redundancy system involved in FIG. 6 relates to two scan lines $Y_{2n-1}$ and $Y_{2n}$ connected relative to each display element 60 rather than in connection with two signal lines $X_{2m-1}$ and $X_{2m}$ as in the case with display element 50 in FIG. 5. The redundancy system of FIG. 6 comprises two isolation elements in the form of TFTs 51 and 52 having their respective source electrodes connected in common to signal lines $X_m$ and their respective drain electrodes connected in common to the driving electrode of display element 60 at point P. However, gate electrodes of TFTs 51 and 52 are connected to respective scan lines $Y_{2n-1}$ and $Y_{2n}$.

If the size of the capacitance of display element 60 is $C_0$, the sizes of the storage capacitors 55, 56, and 57 are respectively $C_5$, $C_6$, and $C_7$, and the sizes of the gate-drain capacitances 53 and 54 of TFTs 51 and 52 are respectively $C_3$ and $C_4$, then the following relationships can be established:

$$C_3 = C_4 \tag{11}$$

$$C_5 = C_6 = C_7 = C_0 \tag{12}$$

Then, even if one or more particular display elements 60 are found to be defective in operation, the same voltage that is applied to other normally operating display elements 60 can also be applied to defective display elements 60 by electrically isolating either one of the two TFTs 51 and 52 and any two of the three storage capacitors 55, 56, or 57, as in the case of the previous embodiment shown in FIG. 5.

FIG. 6A shows the display element circuit of FIG. 6, identified as pixel cell (n,m) in conjunction with an active matrix substrate 59 comprising a plurality of such pixel cells. Scan lines $Y_{2n-1}$ and $Y_{2n}$ as well as all signal line pairs to the last pair of such signal lines, shown here as signal lines $&_{2(n+2)-1}$ and $Y_{2(n+2)}$, have respective pairs of input pads 59A and 59B along an edge of active matrix substrate 59. By the same token, signal lines $X_m$ and $X_{m+1}$ and so on have input pads 60A along another edge of active matrix substrate 59.

Further, the san lines $Y_{2n}$ and $Y_{2n-1}$ are redundant in this embodiment, as were the signal lines $X_{2m-1}$ and $X_{2m}$ in the previous embodiment, and therefore, providing the following two features. The first feature resides in the fact that the address of a defective TFT can be accurately as well as readily obtained. The address of the defective TFT may be electrically obtained by either the use of a test probe which is to directly apply to each display element driving electrode to determine the state of the display element and its accompanying isolation elements or, on the other hand, with the application of the appropriate signals applied to the signal and scan lines via input pads 59A, 59B and 60A, the address of the defective TFT can be determined based upon the results obtained from these applied address signals. Also an optical method may be employed in determining a defective TFT. The address of such defective TFTs is obtained by making a comparison between the image pattern that is displayed on a completed electrooptical display panel by electrically addressing only odd scan lines and the image pattern that is displayed by electrically addressing only even scan lines.

The second feature resides in the fact that it is possible to obtain relief for a defective isolation element due to a lack of electrical integrity of one of the redundant scan lines connected to a good isolation element, or also, possibly due to the removal of the defective isolation element from operation in the display element circuit affecting the electrical integrity of the connected scan line. For example, a scan line $Y_{2n-1}$ or $Y_{2n}$ is disconnected from an isolation element of a particular display element circuit or a short exits between a scan line $Y_n$ and a signal line $X_m$ due, for example, to an isolation element. If there is a disconnection, then repair can be made by electrically connecting down stream the separated ends of the disconnected scan line to its adjacent redundant scan line, such as, by connecting an input pad 59A to an input pad 59B. If the defective terminals of the two scan lines $Y_{2n-1}$ and $Y_{2n}$ are shorted to each other and the same signals applied to both of them, then, the short will be of no consequence unless the scan lines $Y_{2n-1}$ and $Y_{2n}$ happen to be disconnected at two or more different locations. On the other hand, if signal line $X_m$ and either of the scan lines $Y_{2n-1}$ or $Y_{2n}$ are shorted to each other, the particular scan line $Y_n$ in question may be electrically isolated by cutting off the portion along adjacent sides of the position of the short occurs and, thereafter, electrically connecting the cut off ends of the disconnected scan line to its adjacent redundant scan line via connection of an input pad 59A to an input pad 59B thereby providing full relief by electrical disconnection of the shorted signal and scan lines.

Figure 7:
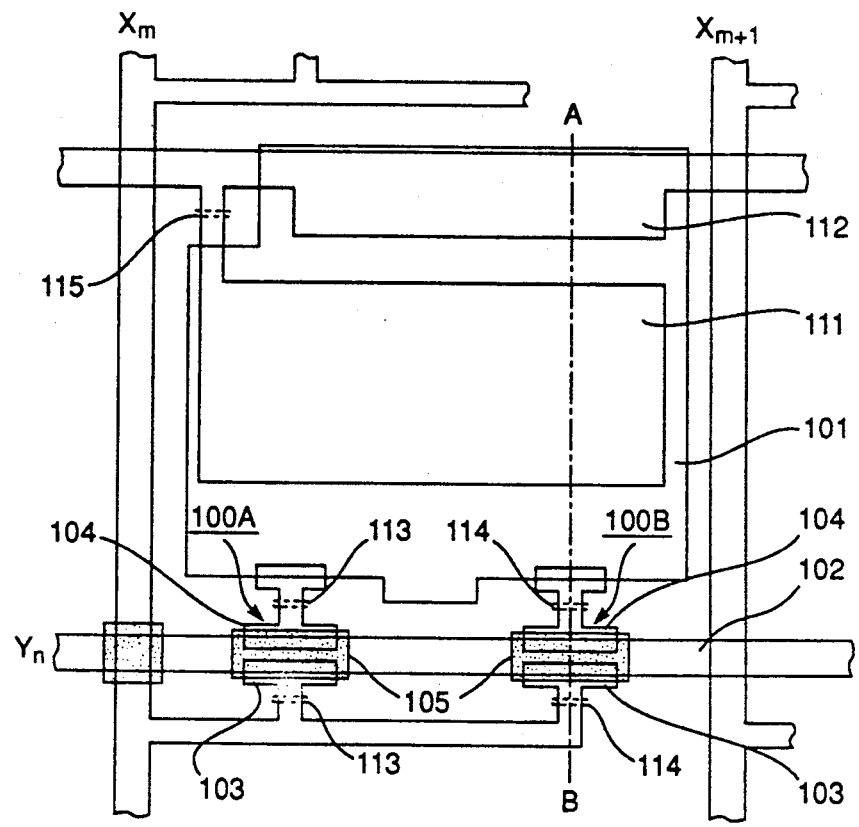
FIG. 7 is a top or plan view of another but similar embodiment of a display element circuit comprising this invention.
Figure 8:
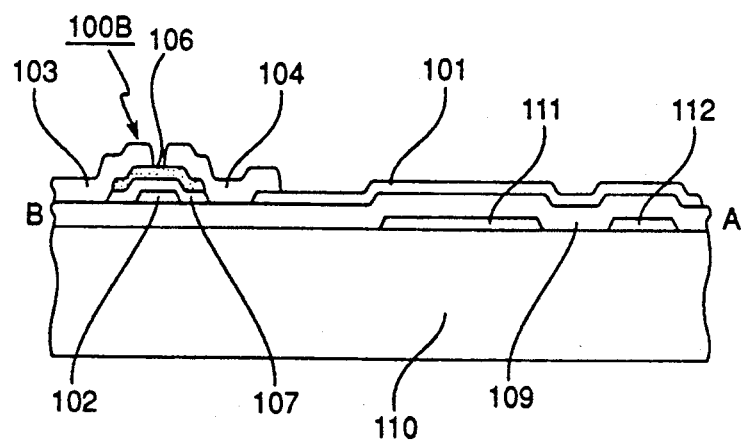
FIG. 8 is a cross sectional illustration taken along the line A-B of FIG. 7.

FIGS. 7 and 8 illustrate the integrated circuit configuration of a single display element circuit of the back plane of an electrooptical display according to this invention. In the embodiment shown here, two TFTs are provided as redundant isolation elements relative to each display element. Therefore, for all practical purposes, the embodiment of FIG. 2 is an equivalent circuit of the embodiment shown in FIG. 7.

In FIGS. 7 and 8, two TFTs 100A and 100B are provided for each display element. TFTs 100A and 100B have respective sources 103 connected to signal line $X_m$, their respective drains 104 connected to driving electrode 101 and their respective gates 102 being common and also constituting scan line $Y_n$. Channel regions 105 of TFTs 100A and 100B comprise a semiconductor film 106 and an insulating film 107. Insulating film 107 is formed between semiconductor film 105 and gate 102. Common electrodes 111 and 112 form respective storage capacitors, having respective values, $C_5$ and $C_6$, established between themselves and driving electrode 101. The driving electrode 101 faces a counter or opposing electrode (not shown) through an electrooptic or light influencing material to form a capacitance therebetween having a value $C_0$. Since the respective sizes of TFTs 100A and 100B are equal to each other, the equation (1) above holds true. Also, equation (2) holds true for values for $C_0$, $C_5$, and $C_6$.

If TFT 100A, upon testing in the manner previously described, is found to be defective, portions 113 may be cut off, or at least one portion thereof, such as portion 113 adjacent to driving electrode 101, is cut off, via laser trimming or other such means. At the same time, portion 115 is also cut off to thereby electrically isolate common electrode 111 responsible for the capacitance value $C_5$. On the other hand, if TFT 100 B is found to be defective, either or both portions 114 and portion 115 may then be cut off in manner as just explained. Such laser trimming is accomplished automatically by a laser beam alignment and trimming machine which, upon proper alignment of the laser beam relative to a portion to be cut off, the laser beam is activated to a proper intensity level sufficient to vaporize and remove the cut off portions 113, 114 or 115 aligned relative to the laser beam. It is preferred that the line width of cutout portions 113 and 114 be smaller than the width of the channel region of each TFT and the line width of cutout portion 115 be smaller than the width of pixel electrode 101. Thus, by forming small width portions at the points where cut off portions 113–115 are to occur eliminates the need to bring about laser trimming of regions as wide as the TFT channel region itself or the display element driving electrode itself.

As shown in FIG. 8, common electrodes 111 and 112 are provided beneath driving electrode 101 with an insulating film 109 interposed therebetween so that an unnecessary amount of voltage will not be applied to the electrooptic material. When inverse staggered TFTs are employed, a gate insulating film 107 and a semiconductor film 106 are stacked over gate 102 and source 103 and drain 104 are connected to appropriate regions of semiconductor film 106. If transparent conductor films are employed to form common electrodes and driving electrodes, a transmission type display device is formed, whereas, if a semiconductor substrate is employed in place of insulating substrate 110 and a metallic material is employed to form driving electrodes, a reflex type display device is formed.

Figure 9:
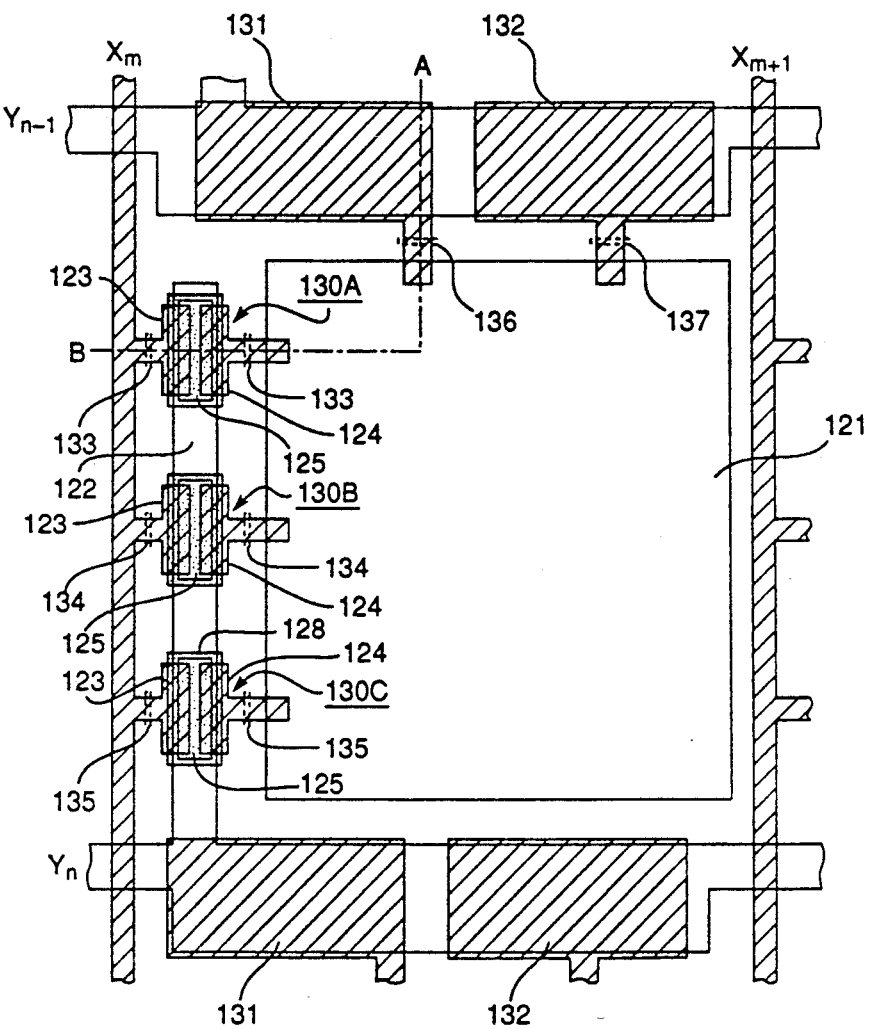
FIG. 9 is a top or plan view of still another embodiment of a display element circuit comprising this invention.
Figure 10:
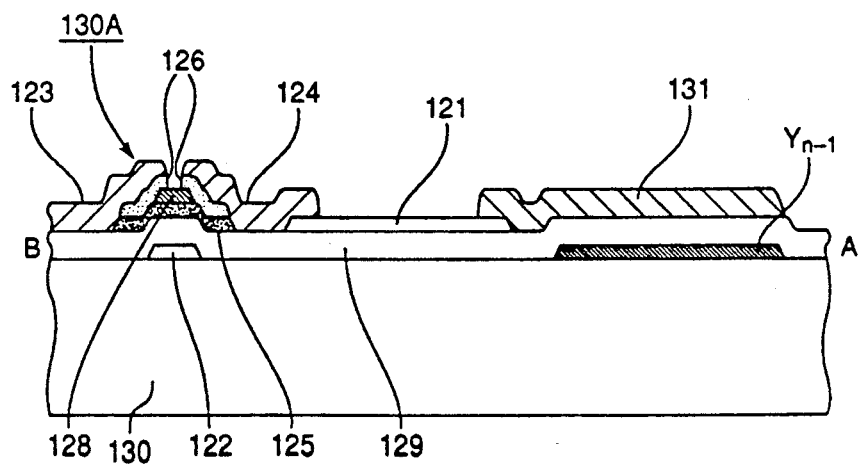
FIG. 10 is a cross sectional view taken along the line A-B of FIG. 9.

FIGS. 9 and 10 illustrate single display element circuit with respect to another embodiment according to this invention. In this embodiment, three isolation elements in the form of TFTs 130A, 130B, and 130C are provided for each display element in a manner similar to FIG. 4. TFTs 130 have their respective sources 123 connected to signal line $X_m$, their respective drains 124 connected to driving electrode 121 and their respective gates 122 connected to scan line $Y_n$. A semiconductor film 125 forms the transistor channel region. A metal region 128 forms an etchant stop to render the film thickness of the channel uniform. Storage capacitor electrodes 131 and 132 are parallel with scan line $Y_{n-1}$ in the preceding display element stage and spaced from scan line $Y_{n-1}$ by an insulating film 129 to form capacitances therebetween. Driving electrode 121 faces an opposing electrode (not shown) through an electrooptic material to form capacitance, $C_0$.

As shown in FIG. 10, storage capacitor electrode 131 is provided over scan line $Y_{n-1}$ in the preceding display element stage with insulating film 129 interposed therebetween so that an unnecessary amount of voltage will not be applied to the electrooptical material thereby providing an arrangement contributing to the improvement in quality and reliability of the display. When inverse staggered TFTs are employed, an insulating film 129 and a semiconductor film or channel 125 are stacked over gate 122. Source 123 and drain 124 are connected to semiconductor film 125 through a semiconductor film 126 containing a large amount of implanted impurity in order to provide good ohmic contact between channel 125 and source 123 or drain 124, e.g., an impurity concentration of about $10^{18}-10^{21}$ per $cm^3$. Etching stop 128 is disposed over the channel region of semiconductor film 125. Driving electrode 121, formed of a transparent conductive film, is connected to both drain 124 and storage capacitor electrode 131. In order to increase product yield, insulating film 129 may be formed as a multilayer film in order to reduce the formation of pinholes.

When a particular TFT 130 is to be electrically isolated due to its defective state, it is cut off at one or both portions 133, 134, or 135, as the case may be, and a corresponding storage capacitor is electrically isolated by cut off at portion 136 or 137 using laser trimming or other such means.

Figure 11:
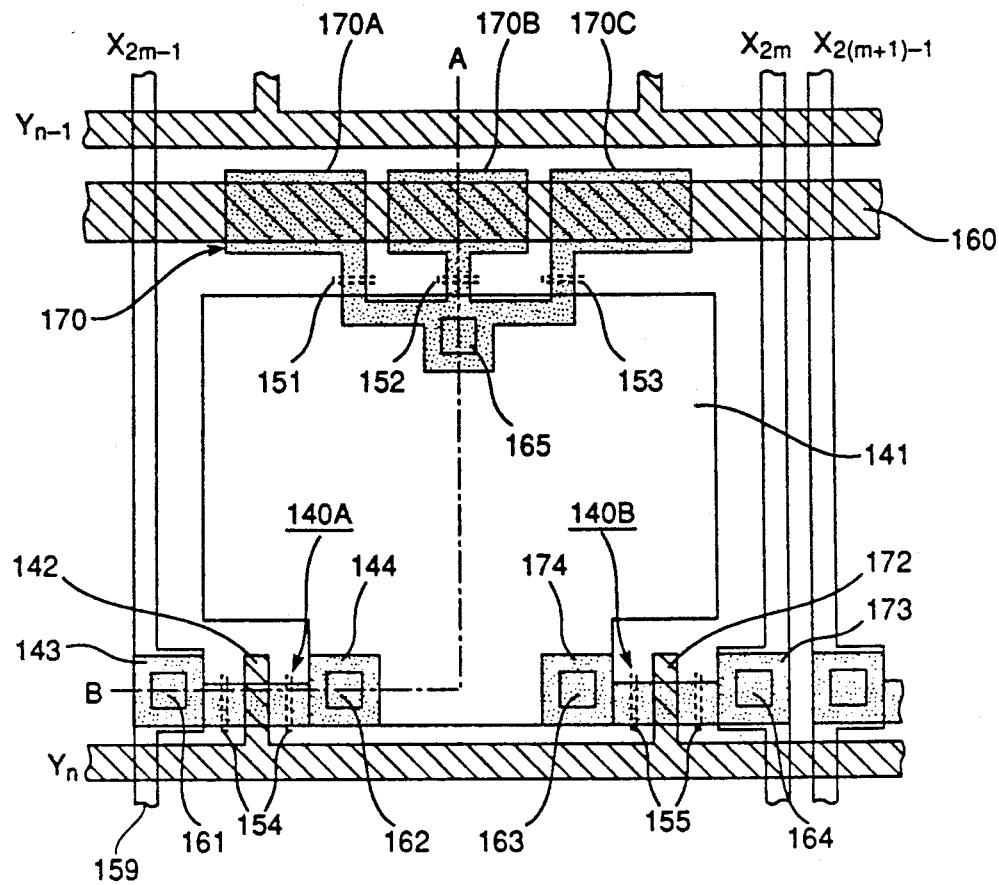
FIG. 11 is a top or plan view of still a further embodiment of a display element circuit of this invention.
Figure 12:
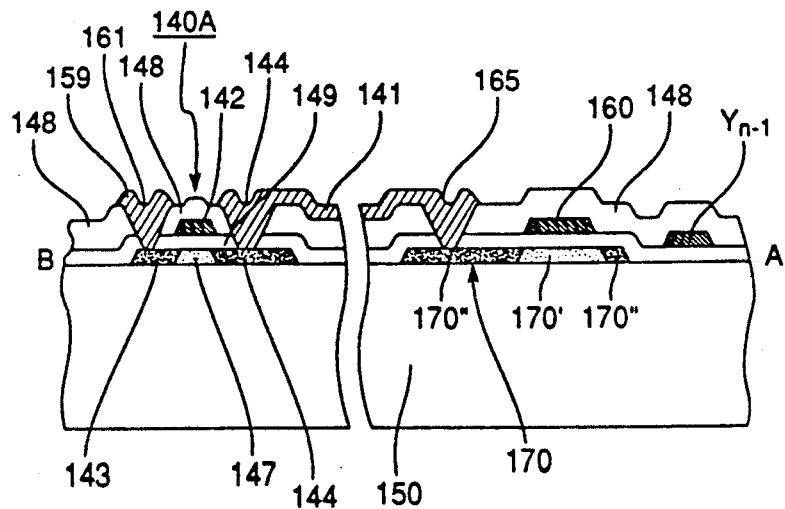
FIG. 12 is a cross sectional view taken along the line A-B of FIG. 11.

FIGS. 11 and 12 illustrate still another single display element circuit with respect to another embodiment according to this invention. In this embodiment, a redundancy system is adopted wherein two TFTs 140A and 140B and two signal lines $X_{2m-1}$ and $X_{2m}$ are provided per display element in a manner similar to the embodiment shown in FIG. 5. TFTs 140A and 140B have their respective sources 143 and 173 connected to respective signal lines $X_{2m-1}$ (also line 159) and $X_{2m}$ via corresponding contact holes 161, 165, their respective drains 144 and 174 connected to driving electrode 141 via corresponding contact holes 162, 163 and their respective gates 142 and 172 connected to scan line $Y_n$. Gates 142 and 172 are isolated from their respective channel regions, such as region 147, by gate insulating film 149. Interlayer insulating film 148 has the primary purpose of isolating signal and scan lines from each other.

With respect to the compensative redundancy means in this embodiment, such means comprises MOS capacitors 170 having three portions 170A, 170B, and 170C, such as the MOS capacitors show in FIG. 4. MOS capacitors 170 are connected together to driving electrode 141 through a single contact hole 165. MOS capacitors 170, as shown in FIG. 12, have a channel region 170' of one conductivity type containing low impurity concentration with terminal regions 170'' of opposite conductivity type containing high impurity concentration. In the situation where MOS capacitance electrodes 170A, 170B and 170C each comprise a semiconductor layer having a low impurity concentration, then, if this semiconductor layer is of n-type conductivity, a positive voltage is applied to common electrode 160; whereas, if this semiconductor layer is of p-type conductivity, a negative voltage is applied to common electrode 160. As a result, an inversion layer is formed on the surface of the semiconductor layer so that capacitors 170 each function as a MOS capacitance. In the case where the impurity concentration of MOS capacitance electrode 170 is high, the potential at common electrode 160 may be set as desired. If MOS capacitance at 170 and TFTs 140A and 140B are of the same conductivity type, MOS capacitance at 170 may be formed concurrently with the formation of TFTs 140A and 140B.

Reference numerals 161 and 164 denote contact holes for connection between respective sources 143 and 173 of TFTs 140A and 140B and corresponding signal lines $X_{2m-1}$ and $X_{2m}$. Reference numerals 162 and 163 denote contact holes for connection between respective drains 144 and 174 of TFTs 140A and 140B and driving electrode 141. Reference numeral 165 denotes a contact hole for connection between MOS capacitance electrode 170 and pixel electrode 141.

When either TFT 140A or 140B is to be electrically isolated due to a defect, the cutoff is accomplished at position 154 or position 155, as the case may be, and, correspondingly, a storage capacitor that is to be likewise electrically isolated, the cutoff is accomplished at position 151, 152, or 153, as the case may be, via laser trimming or other such known treatment.

In the case of staggered TFTs, ion implantation is carried out with gate 142 employed as a mask, so that source and drain regions 143 and 144 are formed having high impurity concentration with channel region 147 having low impurity concentration and formed in self-aligned manner with gate 142, as illustrated in FIG. 12. It is also possible to form TFTs in a non-self-aligned manner by use of two layers of semiconductor films having different impurity concentrations. Common electrode 160 is formed of the same semiconductor film that is employed for gate 142, while MOS capacitance electrode 170 is formed of the same semiconductor film that is employed for the source, drain and channel regions of TFTs 140A and 140B.

If an insulating substrate, such as quartz, is employed and polycrystalline silicon is employed as a semiconductor material in the construction of various semiconductor regions, it is possible to employ a thermal oxide film to form gate insulating film 149 which has preferred gate insulating properties and is better suited for self-alignment structure with greater device density so that a higher density display can be realized. However, this type of substrate is expensive so that it is presently not considered the best approach for a large size electrooptical display.

While the invention has been described in conjunction with several specific embodiments, it is evident to those skilled in the art that many further alternatives, modifications and variations will be apparent in light of the forgoing description. For example, the foregoing embodiments are applicable to any type of display which is formed by combination of isolation elements and an electrooptical or light influencing material. As an example, while discussion in this application is directed to TFTs as isolation elements, this invention is also applicable to the use of isolation elements of the threshold type, such as MIM structures and thin film diode structures. Also, the principal concepts of this invention may also be applicable to other flat panel matrix type displays utilizing active electrooptic mediums, such as of gas plasma, neon or argon type or passive mediums, such as of the electrochromic, electroluminescent or electrophoretic type. Further, it is important to realize that even if the conditions of the above-described equations are not completely satisfied, there will be no discernible difference in operation and function between display element circuits relieved of a defect and normal display element circuits if the conditions of those equations are substantially satisfied. Thus, the invention described herein is intended to embrace all such alternatives, modifications, applications and variations as fall within the spirit and scope of the appended claims.

What is claimed is:

1. In an electrooptical display comprising a matrix of display elements with redundant isolation means forming display element circuits, compensative redundancy means included in each of said display element circuits wherein said circuits containing at least one defect in either one of or both of said isolation means and said compensative redundancy means are relieved thereof by removal of at least one of said isolation means and one of said compensative redundancy means containing said defect so that a resultant signal voltage level for writing capability relative to said relieved display element circuits in said display will remain substantially the same as an existing signal voltage level provided for writing capability relative to normal functioning display elements circuits whereby the overall intensity of said display elements will remain substantially uniform in spite of the removal of one or more of said isolation means and said compensative redundancy means.

2. In the electrooptical display of claim 1 wherein said compensative redundancy means relative to each of said display element circuits comprises storage capacitors connected in parallel to each other and connected in parallel to said display element.

3. In the electrooptical display of claim 2 wherein said storage capacitors are MOS capacitors.

4. In the electrooptical display of claim 2 wherein said display includes orthogonally arranged signal and scan lines, said isolation means comprising switching devices connected in parallel to each other and connected across the intersection of said signal and scan lines.

5. In the electrooptical display of claim 4 wherein said switching devices comprise thin film transistors.

6. In the electrooptical display of claim 2 wherein said display includes orthogonally arranged signal and scan lines, said isolation means comprising threshold devices connected in parallel to each other and connected across the intersection of said signal and scan lines.

7. In the electrooptical display of claim 6 wherein said threshold devices comprise MIM or thin film diode structures.

8. In the electrooptical display of claim 1 further including a plurality of spatially parallel scan lines and a plurality of spatially parallel signal lines orthogonally arranged relative to said display element matrix, said isolation means in each of said display element circuits comprising two or more thin film transistors provided at the intersections of corresponding scan and signal lines, said transistors connected in parallel across said corresponding scan and signal lines and to a corresponding display element, said compensative redundancy means comprising a plurality of compensative storage elements connected in parallel to each other and in parallel with said corresponding display element.

9. In the electrooptical display of claim 8 wherein at least one of the connections formed between at least one of said thin film transistors and said display element or between one of said corresponding scan or signal line on one hand and at least one of said compensative storage elements and said display element on the other hand are severed to provide for said removal.

10. In the electrooptical display of claim 8 wherein said compensative elements comprise storage capacitors.

11. In the electrooptical display of claim 10 wherein said storage capacitors are MOS capacitors.

12. In the electrooptical display of claim 10 wherein each of said storage capacitors includes an electrode connected to a common point including a driving electrode for said corresponding display element, said driving electrode in contact with light influencing material and in opposed relation to a counter electrode forming a capacitance in parallel with the capacitance of said storage capacitors.

13. In the electrooptical display of claim 12 wherein at least one of the connections formed between at least one of said thin film transistors and said common point or between one of said corresponding scan or signal line on one hand and at least one of said storage capacitors and said common point on the other hand are severed to provide for said removal.

14. In the electrooptical display of claim 12 wherein the width of the connection between each of said thin film transistors and said driving electrode is smaller than the channel width of said thin film transistors and the width of the connection between electrodes for said storage capacitors and said driving electrode is smaller than the width of said storage capacitor electrodes.

15. In the electrooptical display of claim 12 wherein a defective portion in either or both of said thin film transistors and said storage capacitors is detected by use of an electrical or optical means and means to electrically isolate one or more of said thin film transistors and said storage capacitors from said driving electrode.

16. In the electrooptical display of claim 8 wherein each of said display element circuits comprise N thin film transistors and a compensative storage element corresponding to the expression, $(C_0+C_s)xC_i/(C_i+C_{n-1})$, wherein $C_i$ is the gate-drain capacitance of the $i^{th}$ thin film transistor, $C_{n-1}$ is the gate-drain capacitance of the remaining $N-1$ thin film transistors, $C_0$ is the capacitance of the light influencing material per display element and $C_2$ is the storage capacitance per display element, said storage element along with a defective thin film transistor electrically isolated from said corresponding display element.

17. In the electrooptical display of claim 1 further including a plurality of spatially disposed, substantially parallel signal lines formed between aligned columns of said display element circuits with a pair of signal lines provided for each of said columns with a signal line in each pair formed along a side of its respective column, said signal line pairs utilized for data signal addressing said display element circuits in each of their respective columns so that if either one of the signal lines in a signal line pair lacks electrical integrity, the other of the signal lines in said signal line pair may be exclusively employed for said signal addressing.

18. In the electrooptical display of claim 1 further including a plurality of spatially disposed, substantially parallel scan lines formed between aligned rows of said display element circuits with a pair of scan lines provided for each of said rows with a scan line in each pair formed along a side of its respective row, said scan line pairs utilized for scan addressing said display element circuits so that if either one of the scan lines in a scan line pair lacks electrical integrity, the other of the scan lines in said signal line pair may be exclusively employed for said scan addressing.

19. In an electrooptical display comprising a plurality of display elements arranged in an array, each of said display elements connected in a display element circuit comprising at least one isolation element for controlling the addressing of a data signal to said display element in response to receipt of a switching signal, said isolation element connected to a respective scan line and a signal line to respectively receive said data and switching signal, the improvement comprising a pair of adjacent signal lines each having an isolation element connected to a corresponding display element, both of said isolation elements of said signal line pairs connected to respectively receive said data and switching signal wherein if one of said paired adjacent signal lines lacks electrical integrity either due to an electrical short or a disconnection condition therein, the other of said adjacent signal lines is exclusively employed for said data signal addressing by connection of remote end regions of said lacking adjacent signal line to remote end regions of its paired adjacent signal line, and means to remove said short in said lacking adjacent signal line in the case where said lacked electrical integrity condition involves a short.

20. In the electrooptical display of claim 19 wherein compensative redundancy means are included in each of said display element circuits so that any one of said circuits containing at least one defect in either one or more of said isolation means or in one or more of said compensative redundancy means are relieved thereof by the electrical isolation in said one circuit of at least one of said isolation means and said compensative redundancy means.

21. In an electrooptical display comprising a plurality of display elements arranged in an array, each of said display elements connected in a display element circuit comprising at least one isolation element for controlling the addressing of a data signal to said display element in response to switching signal, said isolation element connected to a respective scan line and a signal line to respectively receive said data and switching signal, the improvement comprising a pair of adjacent scan lines each having an isolation element connected to a corresponding display element, both of said isolation elements of said scan line pairs connected to respectively receive said data and switching signal wherein if one of said paired adjacent scan lines lacks electrical integrity either due to an electrical short or a disconnection condition therein, the other of said adjacent scan lines is exclusively employed for said addressing by connection of remote end regions of said lacking adjacent scan line to remote end regions of its paired adjacent scan line, and means to remove said short in said lacking adjacent scan line in the case where said lacked electrical integrity condition involves a short.

22. In the electrooptical display of claim 21 wherein compensative redundancy means are included in each of said display element circuits so that any one of said circuits containing at least one defect in either one or more of said isolation means or in one or more of said compensative redundancy means are relieved thereof by the electrical isolation in said one circuit of at least one of said isolation means and said compensative redundancy means.

23. The method of providing redundancy in and correction for defective display element circuits in an electrooptical display containing a plurality of display element circuits each having a display element, wherein said display elements are orthogonally arranged relative to a plurality of spatially arranged parallel scan lines and a plurality of spatially parallel signal lines, wherein said scan lines and said signal lines are formed in orthogonal relationship, and at least one signal line and one scan line are connected to each display element circuit, and comprising the steps of:
providing two or more redundant isolation elements for each display element circuit,
providing two or more redundant compensative elements for each display element circuit wherein said redundant compensative elements are representative of paired impedance in each display element circuit for corresponding isolation elements,
determining if one of said redundant isolation, or redundant compensative elements is defective in said each display element circuit,
electrically isolating a redundant isolation of redundant compensative element from a display element circuit upon determination of its defective state,
electrically isolating a corresponding paired redundant isolation or redundant compensative element from the same display element circuit whereby the applied voltage level required to address via connected signal line and scan line such a display element circuit after the performance of the steps of isolation will remain substantially the same as required before the performance thereof.

24. In the method of claim 23 wherein said redundant compensative elements comprise capacitor structures.

25. In the method of claim 24 wherein said capacitor structures are MOS capacitors.

26. In the method of claim 23 wherein said redundant isolation elements are connected across a signal line and scan line to control the addressing of a data signal to said plurality of circuits in response to switching signals received on said lines and including the steps of:
providing pairs of signal lines for each display element circuit,
determining if one of said paired signal lines lacks electrical integrity either due to a short or a disconnection condition therein,
removing one of said paired signal lines upon determination of its state of lacked electrical integrity.

27. The method of claim 26 wherein the step of removal in the case of a short condition comprises the steps of:
electrically isolating the region of a short in said one paired signal line by forming disconnected ends in said one paired signal line on either side of the short region, and
connecting the disconnected ends of said one paired signal line to the other of said paired signal lines, and
addressing said plurality of circuits via said connected signal lines.

28. The method of claim 26 wherein the step of removal in the case of a disconnection condition comprises the steps of:
connecting disconnected ends of said one paired signal line to the other of said paired signal lines, and
addressing said plurality of circuits via said connected signal lines.

29. In the method of claim 23 wherein said redundant isolation elements are connected across a signal line and scan line to control the addressing of a data signal to said plurality of circuits in response to switching signals received on said lines and including the steps of:
providing pairs of redundant scan lines for each display element circuit,
determining if one of said paired scan lines lacks electrical integrity either due to a short or a disconnection condition therein, and
removing one of said paired scan lines upon determination of its state of lacked electrical integrity.

30. The method of claim 29 wherein the step of removal in the case of a short condition comprises the steps of:
electrically isolating the region of a short in said one paired scan line by forming disconnected ends in said one paired scan line on either side of the short region, and
connecting the disconnected ends of said one paired scan line to the other of said paired scan lines, and
addressing said plurality of circuits via said connected scan lines.

31. The method of claim 29 wherein the step of removal in the case of a disconnection condition comprises the steps of:
connecting disconnected ends of said one paired scan line to the other of said paired scan lines, and
addressing said plurality of circuits via said connected scan lines.

* * * * *